United States Patent
Lee et al.

(10) Patent No.: US 9,631,126 B2
(45) Date of Patent: Apr. 25, 2017

(54) CURABLE ISOBUTYLENE ADHESIVE COPOLYMERS

(71) Applicant: 3M INNOVATIVE PROPERTIES COMPANY, St. Paul, MN (US)

(72) Inventors: Hae-Seung Lee, Woodbury, MN (US); Abdujabar K. Dire, Woodbury, MN (US); Gregg A. Caldwell, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/913,386

(22) PCT Filed: Aug. 25, 2014

(86) PCT No.: PCT/US2014/052502
§ 371 (c)(1),
(2) Date: Feb. 22, 2016

(87) PCT Pub. No.: WO2015/031246
PCT Pub. Date: Mar. 5, 2015

(65) Prior Publication Data
US 2016/0200949 A1    Jul. 14, 2016

Related U.S. Application Data

(60) Provisional application No. 61/870,826, filed on Aug. 28, 2013.

(51) Int. Cl.
| | | |
|---|---|---|
| *B32B 7/12* | (2006.01) | |
| *C09J 123/26* | (2006.01) | |
| *C09J 119/00* | (2006.01) | |
| *C09J 5/00* | (2006.01) | |
| *G06F 3/041* | (2006.01) | |
| *G06F 3/044* | (2006.01) | |
| *H05K 1/02* | (2006.01) | |
| *H05K 1/09* | (2006.01) | |
| *H05K 3/38* | (2006.01) | |
| *H05K 3/46* | (2006.01) | |
| *C09J 7/02* | (2006.01) | |
| *C09J 11/08* | (2006.01) | |

(52) U.S. Cl.
CPC ............ *C09J 119/006* (2013.01); *B32B 7/12* (2013.01); *C09J 5/00* (2013.01); *C09J 7/0214* (2013.01); *C09J 11/08* (2013.01); *C09J 123/26* (2013.01); *G06F 3/044* (2013.01); *G06F 3/0412* (2013.01); *H05K 1/0274* (2013.01); *H05K 1/0296* (2013.01); *H05K 1/09* (2013.01); *H05K 3/386* (2013.01); *H05K 3/4611* (2013.01); *B32B 2250/02* (2013.01); *B32B 2255/26* (2013.01); *B32B 2457/202* (2013.01); *C09J 2415/00* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 5,541,372 A | 7/1996 | Baller | |
| 5,602,221 A | 2/1997 | Bennett | |
| 5,855,972 A * | 1/1999 | Kaeding | ............. E06B 3/66328 428/34 |
| 5,953,477 A * | 9/1999 | Wach | ................. A61B 5/14546 385/115 |
| 6,380,316 B1 * | 4/2002 | Bahadur | ............... C08F 255/08 525/263 |
| 7,148,882 B2 | 12/2006 | Kamrath | |
| 7,538,760 B2 | 5/2009 | Hotelling | |
| 8,361,632 B2 | 1/2013 | Everaerts | |
| 8,361,633 B2 | 1/2013 | Everaerts | |
| 8,597,784 B2 | 12/2013 | Lee | |
| 8,673,996 B2 | 3/2014 | Lee | |
| 2009/0073135 A1 | 3/2009 | Lin | |
| 2009/0087629 A1 | 4/2009 | Everaerts | |
| 2009/0219257 A1 | 9/2009 | Frey | |
| 2009/0237374 A1 | 9/2009 | Li | |
| 2009/0309616 A1 | 12/2009 | Klinghult | |
| 2012/0122359 A1 | 5/2012 | Lee | |
| 2012/0141787 A1 * | 6/2012 | Lee | ........................... C08F 8/42 428/355 EN |
| 2013/0082970 A1 | 4/2013 | Frey | |
| 2014/0138131 A1 | 5/2014 | Hao | |
| 2015/0004345 A1 * | 1/2015 | Chaung | ....................... C09J 5/06 428/41.7 |

FOREIGN PATENT DOCUMENTS

| | | |
|---|---|---|
| DE | 19821355 | * 11/1999 |
| DE | 19821356 | 11/1999 |
| EP | 0252372 | 1/1988 |
| KR | 10-0180693 | 1/1996 |

(Continued)

OTHER PUBLICATIONS

Machine translation of DE 19821355 (no date).*
Dietliker, "Chemistry & Technology of UV & EB Formulation for Coatings, Inks & Paints", 276-298 (1991).
Boileau, "Reaction of functionalised thiols with oligoisobutenes via free-radical addition. Some new routes to thermoplastic crosslinkable polymers", European Polymer Journal, 2003, vol. 39, No. 7, pp. 1395-1404.
International Search Report for PCT International Application No. PCT/US2014/052502, mailed on Nov. 12, 2014, 3 pages.

*Primary Examiner* — Marc Zimmer
(74) *Attorney, Agent, or Firm* — Kent S. Kokko

(57) ABSTRACT

The disclosure provides pressure-sensitive adhesives and adhesive sealants prepared from alkoxysilane modified, crosslinked isobutylene copolymers, and tape articles prepared therefrom. The adhesive is particularly useful in bonding optical displays.

11 Claims, 1 Drawing Sheet

(56) References Cited

FOREIGN PATENT DOCUMENTS

| WO | WO 2009-154812 | 12/2009 |
| WO | WO 2010-019528 | 2/2010 |
| WO | WO 2012-074733 | 6/2012 |
| WO | WO 2012-112856 | 8/2012 |

* cited by examiner

CURABLE ISOBUTYLENE ADHESIVE COPOLYMERS

CROSS REFERENCE TO RELATED APPLICATIONS

This application is a national stage filing under 35 U.S.C. 371 of PCT/US2014/052502, filed Aug. 25, 2014, which claims priority to U.S. Application No. 61/870,826, filed Aug. 28, 2013, the disclosure of which is incorporated by reference in its/their entirety herein.

TECHNICAL FIELD

This invention relates to pressure-sensitive adhesives and adhesive sealants prepared from isobutylene copolymers, and tape articles prepared therefrom. The pressure-sensitive adhesives are characterized by exhibiting an overall balance of adhesive and cohesive characteristics and exceptional performance in the bonding of substrates.

BACKGROUND

Pressure-sensitive tapes are virtually ubiquitous in the home and workplace. In its simplest configuration, a pressure-sensitive tape comprises an adhesive and a backing, and the overall construction is tacky at the use temperature and adheres to a variety of substrates using only moderate pressure to form the bond. In this fashion, pressure-sensitive tapes constitute a complete, self-contained bonding system.

According to the Pressure-Sensitive Tape Council, pressure-sensitive adhesives (PSAs) are known to possess properties including the following: (1) aggressive and permanent tack, (2) adherence with no more than finger pressure, (3) sufficient ability to hold onto an adherend, and (4) sufficient cohesive strength to be removed cleanly from the adherend. Materials that have been found to function well as PSAs include polymers designed and formulated to exhibit the requisite viscoelastic properties resulting in a desired balance of tack, peel adhesion, and shear holding power. PSAs are characterized by being normally tacky at room temperature (e.g., 20° C.). PSAs do not embrace compositions merely because they are sticky or adhere to a surface.

These requirements are assessed generally by means of tests which are designed to individually measure tack, adhesion (peel strength), and cohesion (shear holding power), as noted in A.V. Pocius in Adhesion and Adhesives Technology: An Introduction, $2^{nd}$ Ed., Hanser Gardner Publication, Cincinnati, Ohio, 2002. These measurements taken together constitute the balance of properties often used to characterize a PSA.

With broadened use of pressure-sensitive tapes over the years, performance requirements have become more demanding. Shear holding capability, for example, which originally was intended for applications supporting modest loads at room temperature, has now increased substantially for many applications in terms of operating temperature and load. So-called high performance pressure-sensitive tapes are those capable of supporting loads at elevated temperatures for 10,000 minutes. Increased shear holding capability has generally been accomplished by crosslinking the PSA, although considerable care must be exercised so that high levels of tack and adhesion are retained in order to retain the aforementioned balance of properties.

There are a wide variety of pressure sensitive adhesive (PSA) materials available today that include natural crude or synthetic rubbers, block copolymers, and acrylic ester based polymeric compositions. Central to all PSAs is a desired balance of adhesion and cohesion that is often achieved by optimizing the physical properties of the acrylic elastomer, such as glass transition temperature and modulus. For example, if the glass transition temperature ($T_g$) or modulus of the elastomer is too high and above the Dahlquist criterion for tack (storage modulus of $3 \times 10^6$ dynes/cm$^2$ at room temperature and oscillation frequency of 1 Hz), the material will not be tacky and is not useful by itself as a PSA material. Often in this case, low molecular weight, high $T_g$ resin polymers (tackifiers) or low molecular weight, low $T_g$ polymers (plasticizers) are often used to modulate the $T_g$ and modulus into an optimal PSA range.

SUMMARY

The adhesive (co)polymers of this disclosure comprise: a) a butyl rubber having pendent alkoxysilane groups, b) a tackifier, and c) optionally a non-functionalized poly(isobutylene) polymer. In one aspect the pressure-sensitive adhesive comprises the free-radical reaction product of an isobutylene/isoprene or an isobutylene/butadiene copolymer and a mercaptosilane group.

The pressure-sensitive adhesives of this disclosure provide the desired balance of tack, peel adhesion, and shear holding power, and further conform to the Dahlquist criteria; i.e. the modulus of the adhesive at the application temperature, typically room temperature, is less than $3 \times 10^6$ dynes/cm at a frequency of 1 Hz.

In recent years, there has been a significant increase of the usage of low surface energy, olefin-based thermoplastics (e.g., polyethylene, polypropylene, ethylene propylene diene monomer rubber (EPDM)) in automotives, paints, appliances and electronics markets. The advantages of the new materials include affordable cost, easy processability, and excellent mechanical properties. However, this trend creates a challenge in terms of making adhesive bonds to these low energy surfaces.

When considering adhesive tapes, pressure-sensitive adhesive (PSA) tapes are the easiest to use, but for the most part, pressure-sensitive adhesives do not adhere well to low surface energy substrates. Additionally, most PSAs are unsuited for uses requiring good internal (cohesive) strength at elevated temperatures. For example, rubber-resin PSAs tend to soften and degrade when heated. PSAs based on styrene-containing block copolymers also do not retain good internal strength when heated, because styrene has a low $T_g$ and so softens at moderately elevated temperatures. Currently the bonding to low surface-energy surfaces is achieved by priming the substrate with polar liquid followed by application of PSAs. Even after this two step process, the existing PSAs do not fulfill customer requirements. There is need to develop primerless LSE PSAs at competitive cost but still with the most optimized properties.

Recently, polyisobutylene (PIB) has been considered as an attractive material for low surface energy (LSE) bonding applications due to its excellent adhering properties on olefin-based thermoplastics. In addition, the excellent moisture and oxygen barrier properties of PIB suggest that PIB-based materials have potential use in electronic and photovoltaic encapsulation applications. In spite of its beneficial properties, low cohesive strength of the material has limited the uses for high shear applications. Another possible application for PIB-based material is in the medical adhesive field. Most acrylate-based PSAs are not suitable for medical application since acrylate PSAs tend to give off toxic vapors at elevated temperatures. Acrylate-based PSAs typically contain monomeric materials which, even at ordinary room temperatures, exude odors that make acrylate PSA tapes generally unsuitable for medical uses. Polyisobutylene PSAs are often used for medical uses because they are physiologically inert, but again they tend to be deficient in internal strength.

The adhesive compositions of the present disclosure provide an improved pressure-sensitive composition which may be adhered to a variety of substrates, including low surface-energy (LSE) substrates, within a wide temperature range and provide good adhesive strength and holding characteristics. The adhesive compositions of the present disclosure further provide a pressure-sensitive adhesive articles, such as adhesive tapes and sealants.

In some embodiments, this disclosure provides adhesives useful in bonding optical articles. In particular, the adhesives have desirable properties useful in bonding optical articles including transmissivity, clarity, a low dielectric constant, a high refractive index, and low sensitivity to moisture, and are not corrosive to electronic or electrical components. In particular, the adhesives are useful in bonding capacitive touch components.

As Used Herein

"Alkyl" means a linear or branched, cyclic or acrylic, saturated monovalent hydrocarbon having from one to about twelve carbon atoms, e.g., methyl, ethyl, 1-propyl, 2-propyl, pentyl, and the like.

"Alkylene" means a linear unsaturated divalent hydrocarbon having from one to about twelve carbon atoms or a branched saturated divalent hydrocarbon having from three to about twelve carbon atoms, e.g., methylene, ethylene, propylene, 2-methylpropylene, pentylene, hexylene, and the like.

"Alkenyl" means a linear saturated monovalent hydrocarbon having from one to about twelve carbon atoms or a branched unsaturated hydrocarbon having from three to about twelve carbon atoms.

"Aryl" means a monovalent aromatic, such as phenyl, naphthyl and the like.

"Arylene" means a polyvalent, aromatic, such as phenylene, naphthalene, and the like.

"Aralkylene" means a group defined above with an aryl group attached to the alkylene, e.g., benzyl, 1-naphthylethyl, and the like.

As used herein, "(hetero)hydrocarbyl" is inclusive of hydrocarbyl alkyl and aryl groups, and heterohydrocarbyl heteroalkyl and heteroaryl groups, the later comprising one or more catenary (in-chain) heteroatoms such as ether or amino groups. Heterohydrocarbyl may optionally contain one or more catenary (in-chain) functional groups including ester, amide, urea, urethane, and carbonate functional groups. Unless otherwise indicated, the non-polymeric (hetero)hydrocarbyl groups typically contain from 1 to 60 carbon atoms. Some examples of such heterohydrocarbyls as used herein include, but are not limited to, methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl", "heteroalkyl", "aryl", and "heteroaryl" supra.

DETAILED DESCRIPTION

Figure 1:
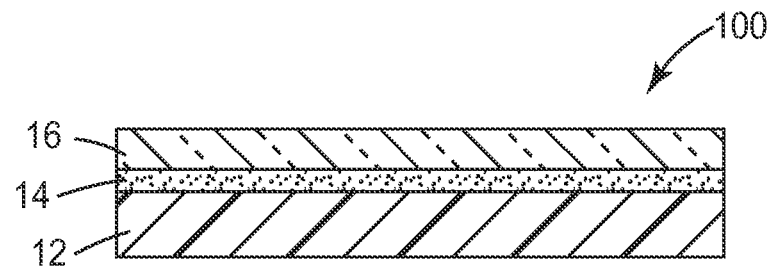
FIG. 1 is a cross section of an exemplary multilayer optical article of this disclosure.

The adhesive copolymer comprises: a) a substituted isobutylene copolymer having pendent alkoxysilane groups, b) a tackifier, and c) optionally a non-functionalized poly(isobutylene) polymer. In one aspect the pressure-sensitive adhesive comprises the interpolymerized reaction product of isobutylene and at least one monomer having pendent alkoxysilane groups.

The substituted isobutylene copolymer having pendent alkoxysilane groups may be represented by the general formula

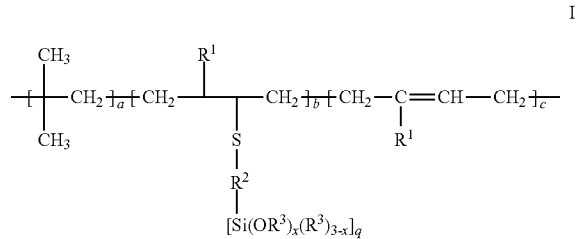

wherein a is at least 20, b is at least 1 and c may be zero; $R^1$ is H or $CH_3$ $R^2$ is a multivalent saturated or unsaturated alkylene or arylene, preferably a saturated alkylene of 1 to ten carbon atoms, optional containing one or more in-chain oxygen atoms; each $R^3$ is an alkyl group or aryl group, x is 1 to 3, and q is 1 or 2.

The subscript b represents a fraction of those isoprene or butadiene repeat units substituted by the alkoxysilane group, and the subscript c represent the unsubstituted isoprene or butadiene units.

Further, with regard to Formula I, the subscripts "b" and "c" are chosen such that the copolymer comprises 1 to 20 wt. % of the respective monomer units: e.g. b and c are such that the siloxane-containing monomer units comprise 1 to 20 wt. % of the copolymer. Typically 1 to 5 percent of the repeat units of the isobutylene copolymer will be substituted by alkoxysilane groups.

The s which are copolymers of mostly isobutylene with a small amount of isoprene, for example, butyl rubbers available under the tradenames VISTANEX (Exxon Chemical Co.) and JSR BUTYL (Japan Butyl Co., Ltd.). In some embodiments, the copolymers also include copolymers of mostly isobutylene with butadiene, which may be subsequently modified to include the pendent unsaturated group.

In some embodiments, a mixture of copolymers may be used, i.e., the first polyisobutylene comprises a homopolymer of isobutylene and the second polyisobutylene comprises butyl rubber, or the first polyisobutylene comprises butyl rubber and the second polyisobutylene comprises a copolymer of isobutylene, subsequently modified. Blends of isobutylene homopolymer and modified poly(isobutylene) are also contemplated.

The copolymer of Formula I is generally prepared by free-radical addition of a mercaptosilane to an isobutylene/isoprene or isobutylene/butadiene copolymer. The mercaptosilane is of the formula:

wherein $R^2$ is a multivalent saturated or unsaturated alkylene or arylene having a valence of q+1, each $R^3$ is an alkyl group or aryl group, x is 1 to 3, and q is 1 or 2.

Useful thiosilanes include (mercaptomethyl)dimethylethoxysilane, (mercaptomethyl)methyldiethoxysilane, 3-mercaptopropylmethyldimethoxysilane, 3-mercaptopropyltriethoxysilane (mercaptomethyl)methyldiethoxysilane.

The addition of the mercaptosilane (III) to the unsaturated butylene copolymers may be effected using free radical initiators. Useful free radical initiators include inorganic and organic peroxides, hydroperoxides, persulfates, azo compounds, redox systems (e.g., a mixture of $K_2S_2O_8$ and $Na_2S_2O_5$), and free radical photoinitiators such as those described by K.K. Dietliker in Chemistry & Technology of UV & EB Formulation for Coatings, Inks & Paints, Volume 3, pages 276-298, SITA Technology Ltd., London (1991). Representative examples include hydrogen peroxide, potassium persulfate, t-butyl hydroperoxide, benzoyl peroxide, t-butyl perbenzoate, cumene hydroperoxide, 2,2'-azobis(2-methylbutyronitrile), (VAZO 67) and azobis(isobutyronitrile) (AIBN). The skilled artisan will recognize that the choice of initiator will depend upon the particular reaction conditions, e.g., choice of solvent.

The curable compositions of this disclosure optionally further comprise non-functional isobutylene (co)polymers. The unfunctionalized isobutylene (co)polymeric synthetic rubbers are generally resins having a polyisobutylene main or a side chain. In some embodiments, the isobutylene (co)polymers are substantially homopolymers of isobutylene, for example, poly(isobutylene) resins available under the tradenames OPPANOL (BASF AG) and GLISSOPAL (BASF AG). In some embodiments, the isobutylene (co)polymeric resins comprise copolymers of isobutylene, for example, synthetic rubbers wherein isobutylene is copolymerized with another monomer. Synthetic rubbers include butyl rubbers which are copolymers of mostly isobutylene with a small amount of isoprene, for example, butyl rubbers available under the tradenames VISTANEX (Exxon Chemical Co.) and JSR BUTYL (Japan Butyl Co., Ltd.). Synthetic rubbers also include copolymers of mostly isobutylene with n-butene or butadiene. In some embodiments, a mixture of isobutylene homopolymer and butyl rubber may be used, i.e., a first polyisobutylene comprises a homopolymer of isobutylene and the second polyisobutylene comprises butyl rubber, or a first polyisobutylene comprises butyl rubber and a second polyisobutylene comprises a homopolymer of isobutylene.

The unfunctionalized isobutylene (co)polymeric synthetic rubber (e.g. PIB) material typically has substantially higher molecular weight than the silane-functionalized (e.g. PIB) synthetic rubber material (described further below). In some embodiments, the weight average molecular weight ($M_w$) of the unfunctionalized isobutylene (co)polymeric synthetic rubber (e.g. PIB) is at least 35,000 grams per mole, at least 100,000 grams per mole, at least 250,000 grams per mole, at least 500,000 grams per mole, or even at least 1,000,000 grams per mole. The weight average molecular weight is typically no greater than 4,000,000 g/mole.

The unfunctionalized isobutylene (co)polymeric synthetic rubber can be a homopolymer, copolymer, or a mixture thereof. Copolymers can be random or block copolymers. Block copolymers can include the polyisobutylene sections in the main backbone, in a side chain, or in both the main backbone and a side chain of the polymer. The polyisobutylene material is typically prepared by polymerizing isobutylene alone or by polymerizing isobutylene plus additional ethylenically unsaturated monomers, such as isoprene, in the presence of a Lewis Acid catalyst such as aluminum chloride, boron trichloride (with titanium tetrachloride as a co-catalyst), or boron trifluoride.

Unfunctionalized isobutylene (co)polymeric rubbers are commercially available from several manufacturers. Homopolymers are commercially available, for example, under the trade designation OPPANOL (e.g., OPPANOL B10, B15, B30, B50, B80, B100, B150, and B200) from BASF Corp. (Florham Park, N.J.). These polymers often have a weight average molecular weight ($M_w$) in the range of about 35,000 to 4,000,000 grams per mole. Still other exemplary homopolymers are commercially available from United Chemical Products (UCP) of St. Petersburg, Russia in a wide range of molecular weights. For example, homopolymers commercially available from UCP under the trade designation SDG have a viscosity average molecular weight ($M_v$) in the range of about 35,000 to 65,000 grams per mole. Homopolymers commercially available from UCP under the trade designation EFROLEN have a viscosity average molecular weight ($M_v$) in the range of about 480,000 to about 4,000,000 grams per mole. Homopolymers commercially available from UCP under the trade designation JHY have a viscosity average molecular weight in the range of about 3000 to about 55,000 grams per mole. These homopolymers typically do not have reactive double bonds. It is appreciated that the unfunctionalized (e.g. PIB) synthetic rubber may have a very small concentration of reactive double bonds or other functional groups that are residual to the polymerization thereof. The concentration of such reactive double bonds or other functional groups is typically less than 5, 4, 3, or 2 mol %. Such olefinic unsaturations are also typically not suitable functional groups for formation of covalent bonds via free-radical polymerization.

The concentration of unfunctionalized isobutylene (co)polymeric synthetic rubber material in the pressure sensitive adhesive composition is typically less than 50 wt. %, preferably greater than 10 wt. %, relative to the total weight of the composition.

Conventional adhesives do not adhere well to certain substrates, such as certain types of automotive paints and low energy surfaces. Efforts have been made to improve the adhesion of adhesives, i.e., develop more aggressive tack, to these types of surfaces; tackifying the base polymer is commonly practiced. Various types of tackifiers include phenol modified terpenes, hydrocarbon resins such as polyvinyl cyclohexane and poly(t-butyl styrene), and rosin esters such as glycerol esters of rosin and pentaerythritol esters of rosin.

Various types of tackifiers include phenol-modified terpenes and rosin esters such as glycerol esters of rosin and pentaerythritol esters of rosin that are available under the trade names Nuroz™, Nutac™ (Newport Industries), Permalyn™, Staybelite™, Foral™ (Eastman). Also available are hydrocarbon resin tackifiers that typically come from C5 and C9 monomers by products of naphtha cracking and are available under the trade names Piccotac™, Eastotac™, Regalrez™, Regalite™ (Eastman), Arkon™ (Arakawa), Norsolene™, Wintack™ (Cray Valley), Nevtack, LX (Neville Chemical Co.), Hikotack™, Hikorez™ (Kolon Chemical), Novares™ (Rutgers N.V.), Quintone™ (Zeon), Escorez™ (Exxonmobile Chemical), Nures™, and H-Rez™ (Newport Industries).

Conventional tackified pressure-sensitive adhesives can also appear cloudy, demonstrating a loss in the characteristic transparency found in many conventional pressure-sensitive adhesive compositions. The cloudiness is an indication of limited or incomplete compatibility of the tackifier and the polymers. The reduced compatibility can lead to a degradation of adhesive properties on aging, as evidenced by a loss of tack or reduced peel adhesion. In some cases, the addition of a tackifier to an adhesive composition can be clear and appear to be compatible. However, after removing the solvent, curing the adhesive, or on aging, the adhesive can become cloudy, indicating some incompatibility between the tackifier and acrylic base polymer.

In many embodiments, the present disclosure provides tackified adhesive compositions that overcome problems noted in the art. The tackifier is preferably selected from a material that is essentially free of any ethylenically or acetylenically unsaturated bonds. The tackifier includes, but is not limited to, hydrogenated rosin resins, hydrogenated and esterified rosin resins, hydrogenated terpene resins, aliphatic petroleum resins, aromatic petroleum resins, alicyclic petroleum resins obtained by hydrogenating aromatic petroleum resins, and the like. Preferably, the tackifier used is selected from hydrogenated $C_9$ petroleum resins such as but not limited to Regalrez™ tackifiers (Eastman) or Arkon™ (Arakawa) tackifiers. Such "hydrophobic tackifiers", may be used in amounts of greater than zero, typically less than 50 wt. %, preferably greater than 1 wt. %, relative to the total weight of the composition.

Plasticizers may also be used in the adhesive formulation to provide wetting action and/or viscosity control. These plasticizers are well known in the art and may include hydrocarbon oils, liquid or soft tackifiers, including liquid hydrocarbon resins, liquid polyterpenes, liquid poly(isobutylenes) such as Glissopal™, and the like, waxes, and mixtures of oils. A plasticizer may be present in the pressure sensitive adhesive of the present invention in an amount of from is typically less than 30 wt. %, preferably greater than 1 wt. %, relative to the total weight of the composition.

In many embodiments, the adhesive composition may comprise comprising
 a) greater than 30 wt. %, preferably greater than 50 wt. %, isobutylene copolymer having pendent alkoxysilane groups;
 b) 0 to 50 wt. % of tackifier, preferably 1 to 50 wt. %, and
 c) 0 to 50 wt. % non-functional poly(isobutylene), preferably 10 to 50 wt. %.

The adhesives of the present invention may be coated upon a variety of flexible and inflexible backing materials using conventional coating techniques to produce adhesive-coated materials. Flexible substrates are defined herein as any material which is conventionally utilized as a tape backing or may be of any other flexible material. Examples include, but are not limited to plastic films such as polypropylene, polyethylene, polyvinyl chloride, polyester (polyethylene terephthalate), polycarbonate, polymethyl(meth)acrylate (PMMA), cellulose acetate, cellulose triacetate, and ethyl cellulose. Foam backings may be used. Examples of inflexible substrates include, but are not limited to, metal, metallized polymeric film, indium tin oxide coated glass and polyester, PMMA plate, polycarbonate plate, glass, or ceramic sheet material. The adhesive-coated sheet materials may take the form of any article conventionally known to be utilized with adhesive compositions such as labels, tapes, signs, covers, marking indices, display components, touch panels, and the like. Flexible backing materials having microreplicated surfaces are also contemplated.

On exposure to water or humidity, the alkoxysilane groups hydrolyze to silanol groups, which crosslink the polymer by forming siloxane linkages with adjacent alkoxysilane groups. As a result of the hydrolysis and crosslinking, the adhesive's cohesive strength properties increase with time. The crosslinking and formation of siloxane groups is illustrated in Scheme V, where $R^6$ represents the polymeric isobutylene radical having at least 20 repeat units. No additional crosslinking agents, such as di- or polyvalent alcohols or amines, are necessary to form the ionic crosslinking. It will be understood that siloxane bonds are labile in the presence of moisture, and constantly cleave and reform.

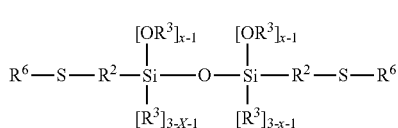

V where
$R^2$ is a multivalent saturated or unsaturated alkylene or arylene;
$R^3$ is an alkyl group or aryl group;
x is 1 to 3, preferably 3;
$R^6$ represents the polymeric isobutylene copolymer of Formula I.

Faster crosslinking is achieved in the presence of a silanol condensation catalyst. Suitable catalysts include organic metal compounds such as tin carboxylates and titanium esters or chelates, e.g., tetrabutyltitanate and bis(acetylacetonyl)di-isopropyl titanate; organic bases such as ethylamine, hexylamine and piperidine; and acids such as the mineral acids and fatty acids. The preferred catalysts are the organic tin compounds, for example, dibutyltindilaurate, dibutyltindiacetate and dibutyltindioctoate. Typically, such catalysts are added in amounts between one part to about 3 parts by weight per 100 parts by weight of the moisture-curable polyisobutylene polymer.

In the absence of a silanol condensation catalyst, hydrolysis proceeds slowly at low relative humidity (less than 50% relative humidity), so that it may be desirable to subject the coated tapes to conditions of high relative humidity (at least 50%) and moderately elevated temperature (e.g., 30° to 100° C.), preferably immediately following the coating step. Instead, the coating can be caused to pick up moisture (e.g., by being exposed to steam), and the moisture-bearing tape can be wound up into a jumbo roll, wherein the support can have a release coating on its backside, which is then heated in an oven until the PSA coating has become moisture-cured. Another technique involves blending a PIB polymer with one to ten weight percent, preferably one to two weight percent of a hydrated salt prior to coating and later heating the tape to produce the moisture-curing, either while the tape is in roll form or after it has been put to use. Suitable hydrated salts include $CuSO_4.5H_2O$, $MgSO_4.7H_2O$, $BaSO_4.2H_2O$, $BaCl_2.2H_2O$, $CaSO_4.2H_2O$.

The above-described compositions are coated on a substrate using conventional coating techniques modified as appropriate to the particular substrate. For example, these compositions can be applied to a variety of solid substrates by methods such as roller coating, flow coating, dip coating, spin coating, spray coating, knife coating, and die coating. These various methods of coating allow the compositions to be placed on the substrate at variable thicknesses thus allowing a wider range of use of the compositions. Coating thicknesses may vary, but coating thicknesses of 2-500 microns (dry thickness), preferably about 25 to 250 microns, are contemplated.

In one embodiment, the adhesive composition may be coated directly on a substrate (from a solution, emulsion or 100% solids) and exposed to a high humidity environment to effect the hydrolysis. In another embodiment adhesive composition may be coated as before, but passively hydrolyzed by exposure to ambient humidity. In either method, the isobutylene polymer may comprise both alkoxysilane groups and the siloxane linkages, as a function of the degree of crosslinking.

In some embodiments, the adhesive compositions, particularly pressure-sensitive adhesive compositions, are applied as a solvent solution or dispersion, the solvent evaporated, and the adhesive composition crosslinked on moisture. Crosslinking of such solvent-based compositions may occur before, but preferably occurs after coating and solvent removal. Suitable solvents such as alkanes, ethyl acetate, toluene and tetrahydrofuran which are unreactive with the functional groups of the components of the copolymer The adhesives of the present disclosure are particularly useful for forming strong bonds to low surface energy (LSE) substrates. As used herein, low surface energy substrates are those having a surface energy of less than about 45 dynes per centimeter, more typically less than about 40 dynes per centimeter, and most typically less than about 35 dynes per centimeter. Included among such materials are polypropylene, polyethylene (e.g., high density polyethylene or HDPE), polystyrene and poly(methyl methacrylate) (PMMA). Other substrates may also have properties of low surface energy due to a residue, such as an oil residue or a film such as paint, being on the surface of the substrate. However, even though the present adhesive bonds well to low surface energy surfaces, the invention is not limited to being bonded to low surface energy substrates, as it has been found that the inventive adhesive can also bond well to higher surface energy substrates such as, for example, other plastics, ceramics, glass and metals.

The substrate is selected depending on the particular application in which it is to be used. For example, the adhesive can be applied to sheeting products, (e.g., decorative graphics and reflective products), label stock, and tape backings. Additionally, the adhesive may be applied directly onto a substrate such as an automotive panel, or a glass window so that another substrate or object can be attached to the panel or window.

The adhesive can also be provided in the form of a pressure-sensitive adhesive transfer tape in which at least one layer of the adhesive is disposed on a release liner for application to a permanent substrate at a later time. The adhesive can also be provided as a single-coated or double-coated tape in which the adhesive is disposed on a permanent backing. Backings can be made from plastics (e.g., polypropylene, including biaxially oriented polypropylene, vinyl, polyethylene, polyester such as polyethylene terephthalate), nonwovens (e.g., papers, cloths, nonwoven scrims), metal foils, foams (e.g., polyacrylic, polyethylene, polyurethane, neoprene), and the like. Foams are commercially available from various suppliers such as 3M Co., Voltek, Sekisui, and others. The foam may be formed as a coextruded sheet with the adhesive on one or both sides of the foam, or the adhesive may be laminated to it. When the adhesive is laminated to a foam, it may be desirable to treat the surface to improve the adhesion of the adhesive to the foam or to any of the other types of backings. Such treatments are typically selected based on the nature of the materials of the adhesive and of the foam or backing and include primers and surface modifications (e.g., corona treatment, surface abrasion). Additional tape constructions include those described in U.S. Pat. No. 5,602,221 (Bennett et al.), incorporated herein by reference. Those skilled in the art will also know that other additives such as fillers, antioxidants, stabilizers, and colorants may be blended with the adhesive for beneficial properties.

For a single-sided tape, the side of the backing surface opposite that where the adhesive is disposed is typically coated with a suitable release material. Release materials are known and include materials such as, for example, silicone, polyethylene, polycarbamate, polyacrylics, and the like. For double coated tapes, another layer of adhesive is disposed on the backing surface opposite that where the adhesive of the invention is disposed. The other layer of adhesive can be different from the adhesive of the invention, e.g., a conventional acrylic PSA, or it can be the same adhesive as the invention, with the same or a different formulation. Double coated tapes are typically carried on a release liner.

This disclosure provides adhesives, e.g. pressure sensitive adhesives, useful in bonding optical articles. Typically, the adhesives are optically clear adhesives (OCAs). OCAs find wide applications in optical displays. Such applications include, but are not limited to, bonding polarizers to modules of a liquid crystal display (LCD) and attaching various optical films to a glass lens in mobile hand held devices (MHH). The polarizers may be in direct or indirect contact with the OCA.

In particular, the adhesives have desirable properties useful in bonding optical articles including transmissivity, clarity, a low dielectric constant, a high refractive index, and low sensitivity to moisture, and are not corrosive to electronic or electrical components. In particular, the adhesives are useful in bonding capacitive touch components.

In one aspect, an optically clear laminate is provided that includes a first substrate having at least one major surface, a second substrate having at least one major surface, and a layer of optically clear adhesive composition situated between and in contact with at least one major surface of the first substrate and at least one major surface of the second substrate. In another aspect, an optically clear laminate is provided that includes a first substrate having at least one major surface, a second substrate having at least one major surface; and a layer of optically clear adhesive composition situated between and in contact with at least one major surface of the first substrate and at least one major surface of the second substrate.

The pressure sensitive adhesive layer may be optically clear. As used herein, the term "optically clear" refers to a material that has a luminous transmission of greater than about 90 percent, a haze of less than about 2 percent, and opacity of less than about 1 percent in the 400 to 700 nm wavelength range. Both the luminous transmission and the haze can be determined using, for example, ASTM-D 1003-95. Typically, the optically clear adhesive may be visually free of bubbles. Desirably, the adhesive is colorless, having a Cielab b* value of less than 0.25, preferably less than 0.20.

Desirably the adhesives of this disclosure have a refractive index of >1.50 to better match the refractive indices of the other optical components and reduce light scattering. A major issue, particularly in capacitive touch screen applications, is that the indium-tin oxide (ITO) patterns often remain highly visible due to the refractive index mismatch between the ITO, the substrate, and, if used, an OCA. Due to the higher reflection of the ITO traces they stand out from the surrounding areas. Especially from some viewing angles and/or under specific light conditions the pattern is clearly visible, which is objected to by the device makers and their customers. The present adhesive reduces or minimizes the problem of easily visible electro-conductive traces, particularly ITO traces. If desired, the refractive index of the adhesive may be further raised by incorporation of inorganic nanoparticles, as described in Applicant's U.S. Publication No. 2014-0138131, published May 22, 2014 and incorporated herein by reference.

The dielectric constant of the adhesive is significant when the adhesive is used in direct bonding of capacitive touch sensors to the display. Displays can generate noise that can be transmitted to the capacitive touch sensor. Furthermore, the display industry trend is to make even thinner devices, which means moving the actual touch sensor closer to the display. Designers typically address this display noise issue in two ways: (1) Selecting the lowest dielectric constant medium, air, which has dielectric constant of approximately 1. This approach while it is best in addressing display noise issue, it comes at great cost of reduced display brightness and contrast, thereby compromising sunlight readability and the desired "black" look when display is off. In case of touch integrated with window and touch integrated with display, air gap is not an option because the window and the display must be optically coupled. (2) Designing built-in firmware that can eliminate display noise. This approach while effect comes at the cost of more expensive displays therefore not an option for most customers.

This disclosure provides low dielectric constant OCAs, which maintains the optical benefits of best display contrast and provides quieter displays. Typical acrylic based OCA may have dielectric constant of 3-5 at 100 KHz and room temperature. Desirably the adhesives of this disclosure have a dielectric constant of <2.5 at 100 KHz and room temperature.

Laminates or multilayer articles are provided that include an optical film or optically clear substrate and an optically clear pressure sensitive adhesive layer adjacent to at least one major surface of the optical film or substrate. The articles can further include another substrate (e.g., permanently or temporarily attached to the pressure sensitive adhesive layer), another adhesive layer, or a combination thereof. As used herein, the term "adjacent" can be used to refer to two layers that are in direct contact or that are separated by one or more thin layers, such as primer or hard coating. Often, adjacent layers are in direct contact. Additionally, laminates are provided that include the pressure sensitive adhesive layer positioned between two substrates, wherein at least one of the substrates is an optical film.

Optical films intentionally enhance, manipulate, control, maintain, transmit, reflect, refract, absorb, retard, filter or otherwise alter light that impinges upon a surface of the film. Films included in the laminates include classes of material that have optical functions, such as polarizers, interference polarizers, reflective polarizers, diffusers, colored optical films, mirrors, louvered optical film, light control films, transparent sheets, brightness enhancement film, anti-glare, and anti-reflective films, and the like. Films for the provided laminates can also include retarder plates such as quarter-wave and half-wave phase retardation optical elements. Other optically clear films include anti-splinter films and electromagnetic interference filters.

In some embodiments, the resulting laminates can be optical elements or can be used to prepare optical elements. As used herein, the term "optical element" refers to an article that has an optical effect or optical application. The optical elements can be used, for example, in electronic displays, architectural applications, transportation applications, projection applications, photonics applications, and graphics applications. Suitable optical elements include, but are not limited to, glazing (e.g., windows and windshields), screens or displays, cathode ray tubes, and reflectors.

Exemplary optically clear substrates include, but are not limited to a display panel, such as liquid crystal display, an OLED display, a touch panel, electrowetting display or a cathode ray tube, a window or glazing, an optical component such as a reflector, polarizer, diffraction grating, mirror, or cover lens, another film such as a decorative film or another optical film.

Representative examples of optically clear substrates include glass and polymeric substrates including those that contain polycarbonates, polyesters (e.g., polyethylene terephthalates and polyethylene naphthalates), polyurethanes, poly(meth)acrylates (e.g., polymethyl methacrylates), polyvinyl alcohols, polyolefins such as polyethylenes, polypropylenes, and cellulose triacetates. Typically, cover lenses can be made of glass, polymethyl methacrylates, or polycarbonate.

In other embodiments, the substrate can be a release liner. Any suitable release liner can be used. Exemplary release liners include those prepared from paper (e.g., Kraft paper) or polymeric material (e.g., polyolefins such as polyethylene or polypropylene, ethylene vinyl acetate, polyurethanes, polyesters such as polyethylene terephthalate, and the like). At least some release liners are coated with a layer of a release agent such as a silicone-containing material or a fluorocarbon-containing material. Exemplary release liners include, but are not limited to, liners commercially available from CP Film (Martinsville, Va.) under the trade designation "T-30" and "T-10" that have a silicone release coating on polyethylene terephthalate film.

The release liner can be removed to adhere the optical film to another substrate (i.e., removal of the release liner exposes a surface of an adhesive layer that subsequently can be bonded to another substrate surface). Often, the adhesive layer is permanently bonded to this other substrate, although in some cases the adhesion may be limited to allow for reworking of the display.

The laminates have at least one of the following properties: the pressure sensitive adhesive layer has optical transmissivity over a useful lifetime of the article, the pressure sensitive adhesive can maintain a sufficient bond strength between layers of the article, the pressure sensitive adhesive can resist or avoid delamination, and the pressure sensitive adhesive can resist bubbling of the adhesive layer over a useful lifetime. The resistance to bubble formation and retention of optical transmissivity can be evaluated using accelerated aging tests. Laminates can often withstand exposure to elevated temperatures (e.g., 60 to 90° C.), optionally, under elevated humidity conditions (e.g., 80 to 90 percent relative humidity), for a period of time (e.g., 1 day to 1 month). In particular the laminates of this disclosure maintain their low haze and high transmission, even after prolonged exposure to elevated temperatures and elevated humidity (e.g., 60 to 90° C. and 80 to 90 percent relative humidity) followed by a rapid cool down to ambient condition (e.g. cooling to room temperature within minutes after exposure to the elevated heat and elevated humidity).

The adhesive compositions of the present disclosure may be applied directly to one or both sides of an optical element such as a polarizer. The polarizer may include additional layers such as an anti-glare layer, a protective layer, a reflective layer, a phase retardation layer, a wide-angle compensation layer, and a brightness enhancing layer. In some embodiments, the pressure sensitive adhesives of the present disclosure may be applied to one or both sides of a liquid crystal cell. It may also be used to adhere a polarizer to a liquid crystal cell. Yet another exemplary set of optical laminates include the application of a cover lens to a LCD panel, the application of a touch panel to an LCD panel, the application of a cover lens to a touch panel, or combinations thereof.

FIG. 1 is a cross sectional illustration of an embodiment of a provided optically clear laminate. The laminate 100 has the instant adhesive composition 14 coated onto substrate 12. Optical film 16 is in contact with adhesive composition 14. The laminate provides an optically clear optical element. Further details regarding these optical article may be found in U.S. Pat. No. 8,361,633 (Everaerts et al.), incorporated herein by reference.

Capacitive touch technology has found increasing utility in various applications, including mobile hand-helds, netbooks and laptop computers. Compared to other touch technologies, capacitive touch enables very sensitive response as well as features such as multi-touch. Optically clear adhesives (OCAs) are often used for bonding purposes (e.g., attachment of different display component layers) in the capacitive touch panel assembly.

Not only do OCAs provide mechanical bonding, but they also can greatly increase the optical quality of the display by eliminating air gaps that reduce brightness and contrast. The optical performance of a display can be improved by minimizing the number of internal reflecting surfaces, thus it may be desirable to remove or at least minimize the number of air gaps between optical elements in the display.

In display assembly, bonding a touch panel or display panel (such as a liquid crystal display (LCD) panel) to a three-dimensional (3D) cover glass by means of an optically clear adhesive can sometimes be challenging. Indeed, newer designs use cover glasses having a thick (approaching 50 micrometers) ink step around the perimeter or frame of the cover glass, generating a substrate that is no longer flat but is a 3-D lens. The region encompassed by the ink step is often referred to as a gap. In addition to the large ink step, other 3D features that may require good adhesive wetting of any of the display components, include things like the presence of a flex connector, slight curvature of the components, thicker ITO patterns, presence of raised integrated circuits on a touch panel and the like.

Optical materials may be used to fill gaps between optical components or substrates of optical assemblies. Optical assemblies comprising a display panel bonded to an optical substrate may benefit if the gap between the two is filled with an optical material that matches or nearly matches the refractive indices of the panel and the substrate. For example, sunlight and ambient light reflection inherent between a display panel and an outer cover sheet may be reduced. Color gamut and contrast of the display panel can be improved under ambient conditions. Optical assemblies having a filled gap can also exhibit improved shock-resistance compared to the same assemblies having an air gap.

An optical assembly having a large size or area can be difficult to manufacture, especially if efficiency and stringent optical quality are desired. A gap between optical components may be filled by pouring or injecting a curable composition into the gap followed by curing the composition to bond the components together. However, these commonly used compositions have long flow-out times which contribute to inefficient manufacturing methods for large optical assemblies.

The optically clear adhesive may be used in transfer tape format to fill the air gap between the display substrates. In this process, the liquid adhesive composition of this invention can be applied between two siliconized release liners, at least one of which is transparent to UV radiation that is useful for curing. The adhesive composition can then be cured (polymerized) by exposure to actinic radiation at a wavelength at least partially absorbed by a photoinitiator contained therein. Alternatively, a thermally activated free-radical initiator may be used, where the liquid adhesive composition of this invention can be coated between two siliconized release liners and exposed to heat to complete the polymerization of the composition. A transfer tape that includes a pressure-sensitive adhesive can be thus formed. The formation of a transfer tape can reduce stress in the adhesive by allowing the cured adhesive to relax prior to lamination. For example, in a typical assembly process, one of the release liners of the transfer tape can be removed and the adhesive can be applied to the display assembly. Then, the second release liner can be removed and lamination to the substrate can be completed. When the substrate and the display panel are rigid adhesive bonding can be assisted with vacuum lamination equipment to assure that bubbles are not formed in the adhesive or at the interfaces between the adhesive and the substrate or display panel. Finally, the assembled display components can be submitted to an autoclave step to finalize the bond and make the optical assembly free of lamination defects.

When the cured adhesive transfer tape is laminated between a printed lens and a second display substrate, prevention of optical defects can be even more challenging because the fully cured adhesive may have to conform to a sometimes large ink step (i.e., 50-70 µm) and the total adhesive thickness acceptable in the display may only be 150-250 µm. Completely wetting this large ink step during initial assembly (for example, when printed lens is laminated to the second substrate with the optically clear adhesive transfer tape of this invention) is very important, because any trapped air bubbles may become very difficult to remove in the subsequent display assembly steps. The optically clear adhesive transfer tape needs to have sufficient compliance (for example, low shear storage modulus, G', at lamination temperature, typically 25° C., of <10e$^5$ Pascal (Pa) when measured at 1 Hz frequency) to enable good ink wetting, by being able to deform quickly, and to comply to the sharp edge of the ink step contour. The adhesive of the transfer tape also has to have sufficient flow to not only comply with the ink step but also wet more completely to the ink surface. The flow of the adhesive can be reflected in the high tan delta value of the material over a broad range of temperatures (i.e. tan $\delta$>0.5 between the glass transition temperature (Tg) of the adhesive (measured by DMA) and about 50° C. or slightly higher). The stress caused by the rapid deformation of the optically clear adhesive tape by the ink step requires the adhesive to respond much faster than the common stress caused by a coefficient of thermal expansion mismatch, such as in polarizer attachment applications where the stress can be relieved over hours instead of seconds or shorter. However, even those adhesives that can achieve this initial ink step wetting may still have too much elastic contribution from the bulk rheology and this can cause the bonded components to distort, which is not acceptable. Even if these display components are dimensionally stable, the stored elastic energy (due to the rapid deformation of the adhesive over the ink step) may find a way to relieve itself by constantly exercising stress on the adhesive, eventually causing failure. Thus, as in the case of liquid bonding of the display components, the design of a transfer tape to successfully bond the display components requires a delicate balance of adhesion, optics, drop test tolerance, as well as compliance to high ink steps, and good flow even when the ink step pushes into the adhesive layer up to as much as 30% or more of its thickness.

In a typical application of an adhesive composition for rigid-to-rigid (e.g., cover glass to touch sensor glass lamination for use in a phone or tablet device) lamination, the lamination is first carried out at either room or elevated temperature. In one embodiment, lamination is carried out at between about 20° C. and about 60° C. At the lamination temperature, the adhesive composition has a tan delta value of between about 0.5 and about 1.0. When the tan delta value is too low (i.e. below 0.5), initial wet out of the adhesive may be difficult and higher lamination pressure and/or longer press times may be required to achieve good wetting. This may result in longer cycle times and possible distortion of one or more of the display substrates. Likewise, if the tan delta value becomes too high (i.e. >1.0) the adhesive composition may be too soft to resist the lamination pressures and adhesive squeeze-out or oozing may result. Such high tan delta values may also result in storage instability of any die cuts that are derived from such an adhesive. For example oozing may result if stored at room temperature.

In a subsequent step, this laminate is then subjected to an autoclave treatment where pressure and temperature (e.g., 5 atmosphere pressure and 60 to 100° C.) are applied to remove any trapped bubbles during the rigid-to-rigid lamination process. The better the flow characteristics of the adhesive, the more easily the adhesive can cover thick ink-steps. Furthermore, good adhesive flow allows for the trapped bubbles from the lamination step to easily escape the adhesive matrix, resulting in a bubble-free laminate after the autoclave treatment. Under autoclave temperatures, the adhesive composition has a tan delta value of between about 0.6 and about 1.0. In particular, the adhesive composition has a tan delta value of between about 0.7 and about 1.0. When the tan delta values at typical autoclave temperatures falls below 0.6 the adhesive may not soften fast enough to further wet the substrate and to allow any lamination step entrapped air bubbles to escape. Likewise, if the tan delta value exceeds about 1.0, the viscous character of the adhesive may be too high and adhesive squeeze-out and oozing may result. Thus the combined benefits of good substrate wetting and easy bubble removal enables an efficient lamination display assembly process with greatly shortened cycle time. In one embodiment, the cycle time for vacuum lamination is less than about 15 seconds and less than about 30 minutes for autoclave treatment.

The ability of the adhesive to flow can be measured using dynamic mechanic analysis (DMA). Pressure sensitive adhesives (PSAs) are viscoelastic materials. The tan delta value from the DMA measurement is the ratio of the viscous component (shear loss modulus G") of the PSA to the elastic component (shear storage modulus G') of the PSA. At temperatures above the glass transition temperature of the PSA, higher tan delta values indicate better adhesive flow.

When used in optical assemblies, the adhesive composition needs to be suitable for optical applications. For example, the adhesive composition may have at least 85% transmission over the range of from 460 to 720 nm. The adhesive composition may have, per millimeter thickness, a transmission of greater than about 85% at 460 nm, greater than about 90% at 530 nm, and greater than about 90% at 670 nm. These transmission characteristics provide for uniform transmission of light across the visible region of the electromagnetic spectrum which is important to maintain the color point in full color displays.

A major issue, particularly in capacitive touch screen applications, is that the ITO patterns often remain highly visible due to the refractive index mismatch between the ITO, substrate, and, if used, an OCA. Due to the higher reflection of the ITO traces they stand out from the surrounding areas. Especially from some viewing angles and/or under specific light conditions the pattern is clearly visible, which is objected to by the device makers and their customers. In view of various previous attempts at solving this problem, e.g., through the use of OCAs with high indices of refraction to match the index of the ITO trace, great technical challenges still remain to hide ITO traces and other electro-conductive traces.

The instant adhesives have higher refractive indices than typical acrylic OCA. Typical acrylic OCA has refractive index of 1.47-1.48 at 632.8 nm while the instant adhesive has a refractive index of 1.52 at 632.8 nm. The instant adhesive maybe used in conjunction with other material to provide even higher refractive index OCA for hiding ITO traces.

Moisture and air permeation is another challenge for some displays. For example, moisture and air permeation into Organic Light-Emitting devices (OLED) and electrophoretic devices can limit the lifetime of the display significantly. Effective encapsulation to prevent the penetration of moisture and air to display is required to make devices with acceptable lifetime. The instant OCA can provide barrier properties and can be used in combination with barrier films with very low moisture barrier performance.

The thickness of the adhesive layer in the articles of disclosure tends to be at greater than about 5 micrometers, greater than about 10 micrometers, greater than about 15 micrometers, or even greater than about 20 micrometers. The thickness is often less than about 1000 micrometers, less than about 250 micrometers, less than about 200 micrometers, or even less than about 175 micrometers. For example, the thickness can be from about 5 to about 1000 micrometers, from about 10 to about 500 micrometers, from about 25 to about 250 micrometers, or from about 50 to about 175 micrometers.

In one embodiment, the adhesive composition is used in an optical assembly that includes a display panel. The display panel can include any type of panel such as a liquid crystal display panel. Liquid crystal display panels are well known and typically include a liquid crystal material disposed between two substantially transparent substrates such as glass or polymer substrates. As used herein, substantially transparent refers to a substrate that is suitable for optical applications, e.g., has at least 85% transmission over the range of from 460 to 720 nm. Optical substrates can have, per millimeter thickness, a transmission of greater than about 85% at 460 nm, greater than about 90% at 530 nm, and greater than about 90% at 670 nm. Transparent electrically conductive materials that function as electrodes can be present on the inner surfaces of the substantially transparent substrates. In some cases, on the outer surfaces of the substantially transparent substrates can be polarizing films that can pass essentially only one polarization state of light. When a voltage is applied selectively across the electrodes, the liquid crystal material can reorient to modify the polarization state of light, such that an image can be created. The liquid crystal display panel can also comprise a liquid crystal material disposed between a thin film transistor array panel having a plurality of thin film transistors arranged in a matrix pattern and a common electrode panel having a common electrode.

In some other embodiments, the display panel may comprise a plasma display panel. Plasma display panels are well known and typically comprise an inert mixture of noble gases such as neon and xenon disposed in tiny cells located between two glass panels. Control circuitry charges electrodes within the panel can cause the gases to ionize and form a plasma which then can excite phosphors contained therein to emit light.

In other embodiments, the display panel may comprise a light-emitting diode (LED) display panel. Light-emitting diodes can be made using organic or inorganic electroluminescent materials and are well known to those having ordinary skill in the art. These panels are essentially a layer of an electroluminescent material disposed between two conductive glass panels. Organic electroluminescent materials include organic light emitting diodes (OLEDs) or a polymer light emitting diode (PLEDs).

In some embodiments, the display panel may comprise an electrophoretic display. Electrophoretic displays are well known and are typically used in display technology referred to as electronic paper or e-paper. Electrophoretic displays can include a liquid electrically-charged material disposed between two transparent electrode panels. Liquid charged material include nanoparticles, dyes, and charge agents suspended in a nonpolar hydrocarbon, or microcapsules filled with electrically-charged particles suspended in a hydrocarbon material. The microcapsules may also be suspended in a layer of liquid polymer. In some embodiments, the display panel can include a cathode ray tube display.

The provided optical assemblies include a substantially transparent substrate. The substantially transparent substrate can include a glass or a polymer. Useful glasses can include borosilicate, soda lime, and other glasses suitable for use in display applications as protective covers. One particular glass that may be used comprises EAGLE XG and JADE glass substrates available from Corning Inc., Corning, N.Y. Useful polymers include polyester films such as polyethylene terephthalate, polycarbonate films or plates, acrylic films such as polymethylmethacrylate films, and cycloolefin polymer films such as ZEONOX and ZEONOR available from Zeon Chemicals (Louisville, Ky.). The substantially transparent substrate typically has an index of refraction close to that of display panel and/or the adhesive layer; for example, from about 1.4 and about 1.7. The substantially transparent substrate typically has a thickness of from about 0.5 mm to about 5 mm.

The provided optical assembly can be touch-sensitive. Touch-sensitive optical assemblies (touch-sensitive panels) can include capacitive sensors, resistive sensors, and projected capacitive sensors. Such sensors include transparent conductive elements on substantially transparent substrates that overlay the display. The conductive elements can be combined with electronic components that can use electrical signals to probe the conductive elements in order to determine the location of an object near or in contact with the display. Touch-sensitive optical assemblies are well known and are disclosed, for example, in U.S. Pat. Publ. Nos. 2009/0073135 (Lin et al.), 2009/0219257 (Frey et al.), and PCT Publ. No. WO 2009/154812 (Frey et al.).

Positional touch-sensitive touch panels that include force sensors are also well known and are disclosed, for example, in touch screen display sensors that include force measurement include examples based on strain gauges such as is disclosed in U.S. Pat. No. 5,541,371 (Baller et al.); examples based on capacitance change between conductive traces or electrodes residing on different layers within the sensor, separated by a dielectric material or a dielectric structure comprising a material and air such as is disclosed in U.S. Pat. No. 7,148,882 (Kamrath et al.) and U.S. Pat. No. 7,538,760 (Hotelling et al.); examples based on resistance change between conductive traces residing on different layers within the sensor, separated by a piezoresistive composite material such as is disclosed in U.S. Pat. Publ. No. 2009/0237374 (Li et al.); and examples based on polarization development between conductive traces residing on different layers within the sensor, separated by a piezoelectric material such as is disclosed in U.S. Pat. Publ. No. 2009/0309616 (Klinghult et al.). Positional touch screens are also disclosed, for example, in U.S. Pat. Publ. No. 2013/0082970 (Frey et al.).

The present disclosure addresses the need for an OCA that is compatible with an electro-conductive traces containing ITO, gold, silver, aluminum, copper and the like. The OCA is in direct contact with the trace in, e.g., a touch panel. The trace-compatible OCA is composed of a pressure sensitive adhesive (PSA) that is non-corrosive.

In one aspect, the present disclosure pertains to an article comprising (a) an optically clear first substrate having an electro-conductive trace comprising indium-tin oxide; (b) an optically clear pressure sensitive adhesive disposed on the first substrate and in contact with the trace, the adhesive of this disclosure. In another aspect, the present disclosure pertains to a method of making an article comprising the steps of (a) providing an optically clear first substrate having an electro-conductive trace comprising indium-tin oxide; (b) providing a pressure sensitive adhesive comprising an optically clear second substrate having a major surface; and the optically clear adhesive disposed on the major surface of the second substrate and (c) laminating the pressure sensitive adhesive to the first substrate such that the optically clear adhesive is in contact with the electro-conductive trace. In one exemplary application, the articles and the method of making the articles described in the present disclosure can be integrated into electronic devices such as, but not limited to, LCD panel, cell phone, hand held device, and a laptop computer.

Figure 2:
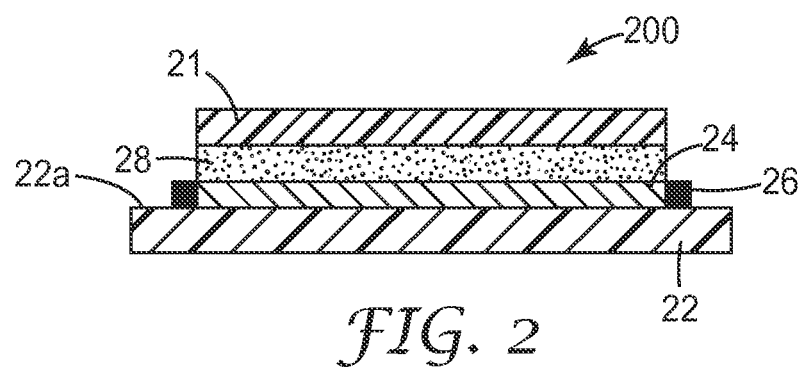
FIG. 2 is a cross section of an exemplary multilayer optical article of this disclosure.

Returning to the figures, FIG. 2 depicts a cross-sectional view of an exemplary article 200 having a first substrate 22. Disposed on a first surface 22a of the substrate is an electro-conductive trace 24 containing indium-tin oxide. The trace forms a grid on the first surface 22a. The edges of the trace end at electrical connector pads 26. An optically clear adhesive 28 is disposed on the trace. Because the trace is in a grid format, a portion of the adhesive 28 may be in direct contact with the first surface 22a of the first substrate 22. Optionally, the embodiment includes a second substrate 21 disposed on the adhesive 28. The first substrate and second substrate, if used, are optically clear. In some exemplary embodiments, they can be plastic, such as a plastic slabs, polymeric films, or glass.

Figure 3:
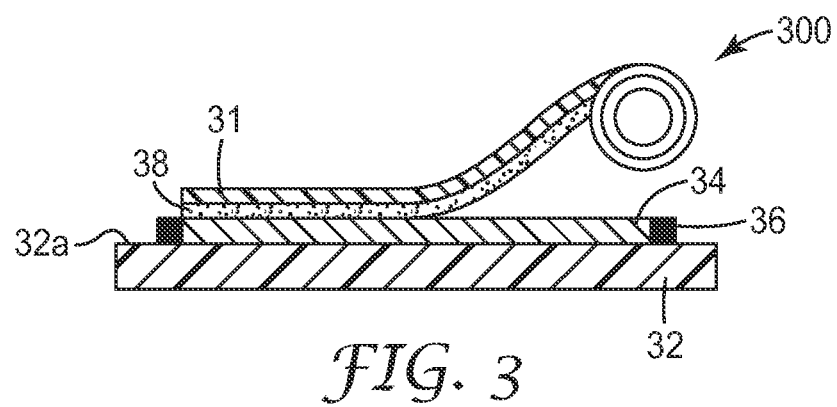
FIG. 3 is a schematic view of an exemplary method of making a multilayer optical article of this disclosure.

FIG. 3 depicts a schematic view of an exemplary process of making an article of FIG. 2. The process includes a step of providing a first substrate 32 having a first surface 32a. An electro-conductive trace 34 with electrical connector pads 36 is disposed on the first surface 32a. A roll of transfer tape 300 is provided. The roll of tape includes an optically clear pressure sensitive adhesive 38 coated on a liner 31. Optionally, the liner includes release coatings allowing for the roll of tape to unwind. The transfer tape is laminated to the first surface 32a of the first substrate 32 such that the adhesive 38 is in contact with the trace 34. In one method, the liner 31 functions as a second substrate and becomes a part of the article. In another method, the liner can be removed and discarded and a second substrate can be laminated on to the adhesive 38. While FIG. 3 depicts the use of a transfer tape, the method can also be practiced using cut sheets of transfer tapes. Further details of the articles and methods may be found in US 2009/0087629 (Everaerts et al.), incorporated herein by reference.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

As used in the examples, "pph" refers to parts per hundred parts of the polymer. One hundred parts of polymer includes the total amount of alkoxysilane modified polyisobutylene polymer and any unfunctionalized polyisobutylene, e.g., MWPIB.

Materials

"BUTYL RUBBER B268" was a copolymer of isobutylene and isoprene obtained from ExxonMobil Corporation, Baytown, Tex. under trade designation "Exxon™ Butyl Rubber B268".

"TACKIFIER" was a cycloaliphatic hydrocarbon based tackifier obtained from ExxonMobil Corporation; Baytown, Tex. under trade designation "Escorez™ 5340".

"MWPIB" was unfunctionalized, medium molecular weight (80,000 g/mol) polyisobutylene obtained from BASF, Florham Park, N.J. under trade designation "Oppanol® B 15".

"PET-1" was a primed polyester film, about 50 micrometer thick, obtained from Mitsubishi Polyester Film, Greer, S.C. under trade designation "Hostaphan® 3SAB".

"PET-2" was a polyester release liner obtained from Siliconature, Chicago, Ill. under trade designation "SILPHAN S 36M".

3-Mercaptopropyltrimethoxysilane, a moisture curable functional chemical, was obtained from Gelest Inc., Morrisville, Pa.

"IRGACURE 651" was a photoradical generator obtained from BASF; Florham Park, N.J. under trade designation "Ciba® IRGACURE® 651".

Toluene was obtained from EMD, Billerica, Mass.

"SANTOPRENE" was a thermoplastic elastomer available from ExxonMobil Corporation, Baytown, Tex. under trade designation "SANTOPRENE™".

Test Methods:

90° Angle Peel Adhesion Strength Test

Peel adhesion strength was measured at a 90° angle using an IMASS SP-200 slip/peel tester (available from IMASS, Inc., Accord, Mass.) at a peel rate of 305 mm/minute (12 inches/minute) using the procedure described in ASTM International standard, D3330, Method F. Test panels were prepared by wiping the panels with a tissue wetted with a solvent using heavy hand pressure to wipe the panel 8-10 times. This procedure was repeated two more times with clean tissues wet with the solvent. The test panels used were high density polyethylene (HDPE), polypropylene (PP), thermoplastic elastomer (TPE), stainless steel (SS), or a soda-lime glass (Glass). Two types of thermoplastic elastomers were used: TPE-1 which was based on ethylene propylene diene monomer (EPDM) and polypropylene or TPE-2 which was based on SANTOPRENE. The solvent used to clean was isopropyl alcohol for HDPE, PP, TPE-1 and TPE-2 panels and heptane for SS and Glass panels. Then the cleaned panel was allowed to dry. The adhesive tape was cut into strips measuring 1.27 cm×20 cm (½ in.×8 in.) and the strips were rolled down onto the cleaned panel with a 2.0 kg (4.5 lb.) rubber roller using 2 passes. The prepared samples were stored at 23° C. and at 50% relative humidity (RH) for 24 hours before testing. Two samples were tested for each example and averaged values were expressed in N/dm. Failure mode was noted and recorded as cohesive (COH), i.e., the adhesive split leaving residue on both the tape and test surface, adhesive (ADH), i.e., the adhesive peeled cleanly from the test surface, or mixture (MIX) of COH and ADH failures, i.e., the adhesive peeled cleanly from some areas and adhered to the surface in other areas.

Static Shear Strength

The static shear strength was evaluated as described in the ASTM International standard, D3654, Procedure A at 23° C. and 50% RH using a 1000 g load. Tape test samples measuring 1.27 cm×15.24 cm (½ inch×6 inches.) were adhered to 3.8 cm×5 cm (1.5 inch by 2 inch) stainless steel (SS) panels using the method to clean the panel and adhere the tape described in the peel adhesion test. The tape overlapped the panel by 1.27 cm×2.5 cm. and the strip was folded over itself on the adhesive side, and then folded again. A hook was hung in the second fold and secured by stapling the tape above the hook. The weight was attached to the hook and the panels were hung in a room set at 23° C. and 50% RH. The time to failure in minutes was recorded. If no failure was observed after 10,000 minutes, the test was stopped and a value of 10,000 minutes was recorded. The mode of failure as described in the peel adhesion test was also noted.

Optical Property Measurement

Optical properties of adhesives were measured by sandwiching dried tapes between 1.0 mm-thick, 5 cm×7.5 cm (2 inches×3 inches) slide glasses (obtained from VWR International, Radnor, Pa., Micro Slides, Catalog number 48382-179). Haze, transmission and color of optically clear adhesives (OCA) were measured using a HunterLab UltraScan PRO (available from Hunter Associates Laboratory, Inc, Reston, Va.).

Preparative Example 1 (PE1)

Preparation of 3-Mercaptopropyltrimethoxysilane Grafted PIB (Polymer 1)

In a three-neck, round-bottomed flask equipped with a mechanical stirrer, thermometer, and a nitrogen inlet was placed BUTYL RUBBER B268 (30.0 g), 3-Mercaptopropyltrimethoxysilane (1.76 g), IRGACURE 651 (0.46 g) and toluene (170.0 g). The contents of the flask were stirred with a magnetic stir bar under nitrogen atmosphere at elevated temperatures (e.g., 40-50° C.). Once all the components completely dissolved, the flask was cooled to room temperature. The mixture was then UV irradiated for 6 minutes with an ultraviolet bulb (Sylvania Blacklight Blue F15T8/BLB, 15, available from Osram Sylvania, Danvers, Mass.). During the UV irradiation, the solution was stirred with a mechanical stirrer. The solution was used for further formulations without purification.

Examples 1-2 (EX1-EX2) and Comparative
Examples 1-2 (CE1-CE2)

EX1 adhesive composition was prepared by mixing 100 parts of Polymer 1 prepared above in PE1 and 20 parts of ESCOREZ 5340 in a 100 mL jar containing 400 parts of toluene and then milling the mixture overnight on a roller mill. EX2 adhesive composition was prepared in the same manner as EX1 except that by mixing 70 parts Polymer 1, 30 parts MWPIB and 20 parts of ESCOREZ 5340 in a 100 mL jar containing 400 parts of toluene. CE1 and CE2 adhesive compositions were prepared in the same manner as EX1 and EX2, respectively, except that Polymer 1 was replaced with BUTYL RUBBER B268.

The resulting EX1-EX2 and CE1-CE2 adhesive compositions were knife-coated onto the primed side of a 15 cm×63.5 cm (6 inches by 25 inches) strip of PET-1 film to a wet thickness of about 381 μm (15 mils). The coated film was dried in an oven set at 70° C. for 60 minutes to provide a tape having an adhesive coating thickness of 50 μm (2 mils). The tapes were conditioned at 23° C. and 50% RH for 24 hours before testing for 90° Peel Adhesion and shear strength at room temperature (RT Shear). Test results are shown in Table 1, below.

TABLE 1

| Example | 90° Peel Adhesion (N/dm) on Substrate | | | | | | | RT Shear | |
|---|---|---|---|---|---|---|---|---|---|
| | HDPE | PP | TPE-1 | TPE-2 | SS | Glass | Failure | Time (min) | Failure |
| EX1 | 16.7 | 55.4 | 22.8 | 61.7 | 47.1 | 41.4 | ADH | 10000 | N/F |
| EX2 | 18.2 | 66.5 | 31.4 | 103.6 | 41.6 | 42.1 | ADH | 10000 | N/F |
| CE1 | 16.5 | 47.4 | 26.8 | 34.1 | 54.9 | 41.0 | MIX | 5400 | COH |
| CE2 | 16.2 | 59.4 | 35.6 | 77.2 | 38.7 | 36.6 | COH | 1250 | COH |

N/F = not failed

Examples 3-6 (EX3-EX6)

EX3 and EX4 adhesive compositions and tapes were prepared as described in EX1 except the adhesive thickness was varied (i.e., 50 and 100 μm thick for EX3 and EX4, respectively) and coating substrate was PET-2, a release liner. EX5 and EX6 adhesive compositions and tapes were prepared as described in EX2 except the adhesive thickness was varied (i.e., 50 and 100 μm thick for EX3 and EX4, respectively) and coating substrate was PET-2, a release liner. Dried adhesives of EX3-EX6 on the PET-2 release liner were transferred and laminated on 1.0 mm-thick, 5 cm×7.5 cm (2 inches×3 inches) micro slide glasses (obtained from VWR International, Radnor, Pa., Micro Slides, Catalog number 48382-179) and their optical properties were measured as described above. Table 2 below summarizes the result of optical properties of EX3-EX6 adhesive compositions.

TABLE 2

| Example | % Transmission | % Haze | b* |
|---|---|---|---|
| EX3 | 91.0 | 0.4 | 0.19 |
| EX4 | 90.7 | 0.4 | 0.21 |
| EX5 | 90.9 | 0.4 | 0.21 |
| EX6 | 91.1 | 0.4 | 0.20 |

This disclosure provides the following embodiments:
1. A curable isobutylene copolymer composition comprising:
   a substituted isobutylene copolymer of the formula:

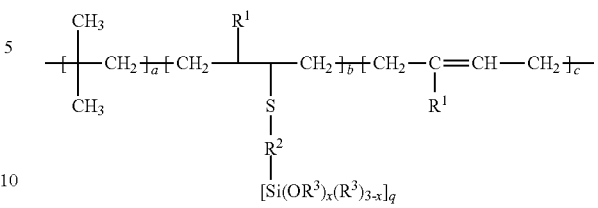

wherein
   wherein a is at least 20, b is at least 1 and c may be zero;
   R2 is a multivalent saturated or unsaturated alkylene or arylene, each R3 is an alkyl group or aryl group, x is 1 to 3, and q is 1 or 2, and a tackifier.
2. The curable isobutylene copolymer of embodiment 1 wherein 1 to 5 percent of the repeat units of the isobutylene copolymer will be substituted by alkoxysilane groups.
3. The curable isobutylene copolymer of any of the previous embodiments comprising greater than 0% by weight but less than 20% by weight of polymerized monomer units having pendent alkoxysilane groups.
4. The curable isobutylene copolymer of embodiment 3 wherein the polymerized monomer units having pendent alkoxysilane groups are isoprene monomer units.
5. The curable isobutylene copolymer composition of any of the previous embodiments comprising 1 to 50 wt. % tackifier, relative to the total weight of the composition.
6. The curable isobutylene copolymer of embodiment 1 wherein R1 is a divalent alkylene or arylene, and R2 is a divalent alkylene.
7. The curable isobutylene copolymer composition of any of the previous embodiments further comprising a non-functionalized poly(isobutylene) polymer.
8. The curable isobutylene copolymer composition of any of the previous embodiments comprising
   a) greater than 30 wt. % isobutylene copolymer having pendent alkoxysilane groups;
   b) 1 to 50 wt. % of tackifier, and
   c) 10 to 50 wt. % non-functional isobutylene (co)polymers
9. The crosslinked curable isobutylene copolymer composition of any of the previous embodiments.
10. The crosslinked composition of embodiment 9 having siloxane crosslinks.
11. An adhesive article comprising a crosslinked coating of the curable isobutylene copolymer of embodiment 9 or 10 on a backing
12. The curable isobutylene copolymer composition any of the previous embodiments comprising 10 to 50 wt. % of said tackifier relative to the total weight of the composition.

13. The curable isobutylene copolymer composition of any of the previous embodiments wherein the copolymer has a molecular weight (Mw) of 50,000 to 5,000,000.

14. The curable isobutylene copolymer composition of any of the previous embodiments, wherein said isobutylene copolymer having pendent alkoxysilane groups, is prepared by free radical addition of mercaptosilane compound to an isobutylene copolymer.

15. The curable composition of embodiment 1 wherein the substituted isobutylene copolymer is prepared by the free radical addition of mercaptosilane to an isobutylene copolymer.

16. The curable composition of embodiment 15 wherein the mercaptosilane is of the formula:

wherein
$R^2$ is a multivalent saturated or unsaturated alkylene or arylene, each $R^3$ is an alkyl group or aryl group, x is 1 to 3, and q is 1 or 2.

17. An optically clear laminate comprising:
a first substrate having at least one major surface;
a second substrate having at least one major surface; and
the adhesive composition of embodiment 1 disposed between and in contact with at least one major surface of the first substrate and at least one major surface of the second substrate.

18. The optical clear laminate of embodiment 17 wherein the laminate has an average transmissivity between 450 nanometers and 650 nanometers of greater than about 85%.

19. An article comprising:
an optically clear first substrate having an electro-conductive trace;
the optically clear pressure sensitive adhesive of embodiment 1 disposed on the first substrate and in contact with the trace.

20. The article of embodiment 19, further comprising an optically clear second substrate disposed on the adhesive.

21. The article of embodiment 20, wherein the first and second substrates are selected from the group consisting of plastic, polymeric film, and glass.

22. The article of embodiment 19, integrated into an electronic device selected from the group consisting of LCD panel, cell phone, hand held device, and a laptop computer.

23. The article of embodiment 19 where the electroconductive trace is selected from indium-tin oxide, gold, silver, copper or aluminum.

24. A method of making an article comprising the steps of:
providing an optically clear first substrate having an electro-conductive trace;
providing the pressure sensitive adhesive of embodiment 1; and
laminating the pressure sensitive adhesive to the first substrate such that the optically clear adhesive is in contact with the electro-conductive trace.

25. The method of embodiment 24 where the electroconductive trace is selected from indium-tin oxide, gold, silver, copper or aluminum.

We claim:
1. An article comprising:
an optically clear first substrate having an electro-conductive trace;
an optically clear pressure sensitive adhesive disposed on the first substrate and in contact with the trace, the adhesive comprising
a) a substituted isobutylene copolymer of the formula:

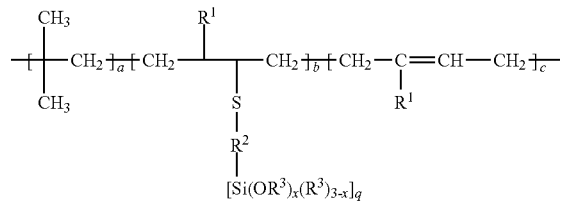

wherein a is at least 20, b is at least 1 and c may be zero;
$R^1$ is H or $CH_3$;
$R^2$ is a multivalent saturated or unsaturated alkylene or arylene, each $R^3$ is an alkyl group or aryl group, x is 1 to 3, and q is 1 or 2, and
b) a tackifier.

2. The article of claim 1, further comprising an optically clear second substrate disposed on the adhesive.

3. The article of claim 2, wherein the first and second substrates are selected from the group consisting of plastic, polymeric film, and glass.

4. The article of claim 2, integrated into an electronic device selected from the group consisting of LCD panel, cell phone, hand held device, and a laptop computer.

5. The article of claim 2 where the electroconductive trace is selected from indium-tin oxide, gold, silver, copper or aluminum.

6. The article of claim 1 wherein the isobutylene copolymer comprises greater than 0% by weight but less than 20% by weight of polymerized monomer units having pendent alkoxysilane groups.

7. The article of claim 1 wherein the adhesive comprises 1 to 50 wt. % tackifier, relative to the total weight of the composition.

8. The article of claim 1 wherein the adhesive further comprises a non-functionalized poly(isobutylene) polymer.

9. The article of claim 8 wherein the adhesive comprises:
a) greater than 30 wt. % isobutylene copolymer having pendent alkoxysilane groups;
b) 1 to 50 wt. % of tackifier; and
c) 10 to 50 wt. % non-functional isobutylene (co)polymers.

10. A method of making an article of claim 1 comprising the steps of:
providing an optically clear first substrate having an electro-conductive trace;
providing the pressure sensitive adhesive of claim 1; and
laminating the pressure sensitive adhesive to the first substrate such that the optically clear adhesive is in contact with the electro-conductive trace, wherein the adhesive comprises
a) a substituted isobutylene copolymer of the formula:

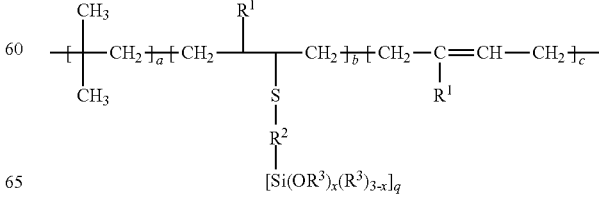

wherein a is at least 20, b is at least 1 and c may be zero;

$R^1$ is H or $CH_3$;

$R^2$ is a multivalent saturated or unsaturated alkylene or arylene, each $R^3$ is an alkyl group or aryl group, x is 1 to 3, and q is 1 or 2, and b) a tackifier.

11. The method of claim 10 where the electroconductive trace is selected from indium-tin oxide, gold, silver, copper or aluminum.

* * * * *